United States Patent
Yu et al.

[11] Patent Number: 6,063,207
[45] Date of Patent: May 16, 2000

[54] SURFACE TREATMENT FOR BONDING PAD

[75] Inventors: Chia-Chieh Yu, Taipei; Ta-Cheng Chou, Hsinchu, both of Taiwan

[73] Assignee: United Semiconductor Corp., Hsinchu, Taiwan

[21] Appl. No.: 09/241,525

[22] Filed: Feb. 1, 1999

[30] Foreign Application Priority Data

Nov. 27, 1998 [TW] Taiwan .................................. 87119709

[51] Int. Cl.⁷ .............................. H01L 21/00; C23F 1/00
[52] U.S. Cl. ............................ 134/2; 134/26; 438/115; 438/906
[58] Field of Search ................ 134/2, 6, 3, 25.4, 134/26, 11, 31, 902; 438/115, 612, 906

[56] References Cited

U.S. PATENT DOCUMENTS

| | | | |
|---|---|---|---|
| 5,336,371 | 8/1994 | Chung et al. .................. | 156/659.1 |
| 5,434,104 | 7/1995 | Cain et al. ..................... | 637/198 |
| 5,470,393 | 11/1995 | Fukazawa ..................... | 134/3 |
| 5,635,053 | 6/1997 | Aoki et al. ..................... | 205/746 |
| 5,766,368 | 6/1998 | Bowers ......................... | 134/6 |
| 5,824,234 | 10/1998 | Jou et al. ....................... | 216/18 |
| 5,849,639 | 12/1998 | Molloy et al. ................. | 438/714 |
| 5,883,650 | 3/1999 | Figueredo et al. ............. | 347/62 |
| 5,936,296 | 8/1999 | Park et al. ..................... | 257/529 |

*Primary Examiner*—Randy Gulakowski
*Assistant Examiner*—Shamim Ahmed
*Attorney, Agent, or Firm*—Jiawei Huang; J.C. Patents

[57] ABSTRACT

A surface treatment method for bonding pad is described, in which a passivation layer is formed on a bonding pad and an opening is formed within the passivation by a plasma etching process. The bonding pad is corroded by the etching plasma containing fluorine during the etching process. The bonding pad is rinsed with deionized water comprising carbon dioxide to reduce the effects of the corrosion phenomenon.

14 Claims, 2 Drawing Sheets

SURFACE TREATMENT FOR BONDING PAD

CROSS-REFERENCE TO RELATED APPLICATION

This application claims the priority benefit of Taiwan application serial no. 87119709, filed Nov. 27, 1998, the full disclosure of which is incorporated herein by reference.

BACKGROUND OF THE INVENTION

1. Field of the Invention

The invention relates to a method of fabricating an integrated circuit, and more particularly to a surface treatment method for a bonding pad.

2. Description of Related Art

After an integrated circuit device has completed the fabrication process, it is often assembled into a package to be utilized on a printed circuit board as part of a larger circuit. In order to connect electrically the package with the fabricated devices, a metal bond is formed on the bonding pad of the device. The bonding pad must be clean since any small amount of contamination can cause a metal bond failure and reduce yields.

In a process of fabricating, an aluminum bonding pad, the passivation layer located on the bonding pad is etched by plasma containing fluorine to form an opening within the passivation layer, and the bonding pad is therefore exposed to form a metal bond. However, during the etching, the fluorine in the plasma makes corrosion by reacting with the surface of the aluminum bonding pad. The corrosion causes metal bond failures and reduces yields (e.g. metal won't properly adhere to the bonding pad).

SUMMARY OF THE INVENTION

The present invention provides a surface treatment method for a bonding pad to reduce the effects of the bonding pad corrosion phenomenon.

In accordance with the present invention, the invention provides a surface treatment method for a bonding pad. A bonding pad containing aluminum is formed on a substrate. A passivation layer and a polyimide layer with a desired pattern are sequentially formed over the bonding pad and the substrate. By using the polyimide layer as an etching mask, the passivation layer is etched by plasma to form an opening until the bonding pad is exposed. The plasma containing fluorine reacts with the bonding pad to make corrosion. The corrosion phenomenon is improved by rinsing the bonding pad with deionized water comprising carbon dioxide. In addition, the thin oxide layer which often exists on the bonding pad surface is thicker after the rinsing step. The thicker oxide layer is helpful in preventing the bonding pad from sustaining further corrosion.

It is to be understood that both the foregoing general description and the following detailed description are exemplary and explanatory only and are not restrictive of the invention, as claimed.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Figure 1A:
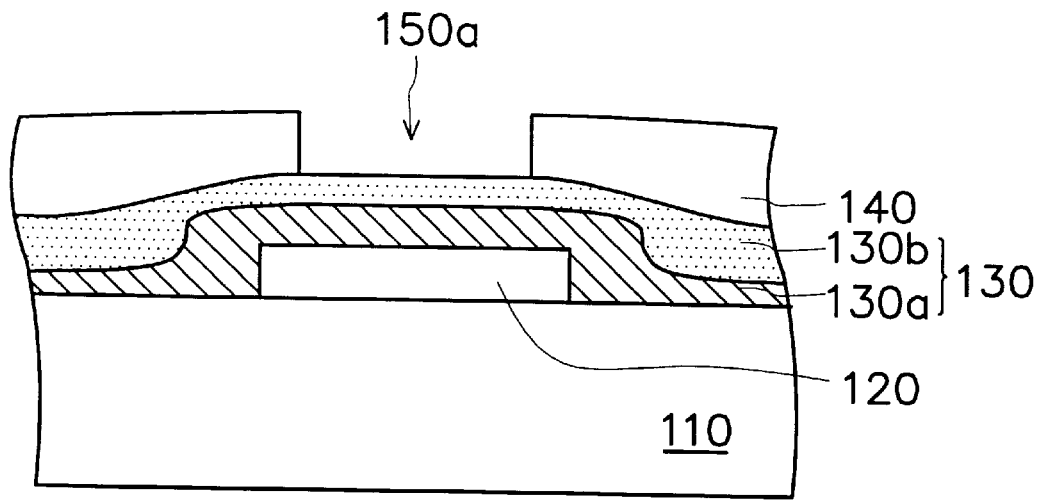
FIG. 1A–1B are schematic, cross sectional views illustrating fabrication of a bonding pad in a preferred embodiment according to the invention.

Referring to FIG. 1A, a substrate 110 having device structure is provided. A metal layer is formed to cover the substrate 110 and then patterned to form a bonding pad 120. The bonding pad 120 is made of a material such as aluminum or aluminum alloys and is formed by magnetron DC sputtering.

A passivation layer 130 is formed over the bonding pad 120 and the substrate 110. The passivation layer 130 comprises a layer of phosphosilicate glass (PSG) 130a with a thickness of about 2000 to 7000 Å and a silicon nitride 130b layer with a thickness of about 5000 to 9000 Å. The passivation layer 130 is formed by, for example, chemical vapor deposition (CVD).

The silicon nitride layer 130b and the PSG 130a are normally used for passivation. The density of the silicon nitride layer 130b is high and its hardness is high enough to prevent moisture and alkaline ions from penetrating through and to protect the device from being damaged mechanically. Gettering of phosphorus ions in the PSG 130b can prevent penetration of moisture and alkaline ions, and the lifetime of the integrated circuit can thus be prolonged.

A polyimide layer 140 with a desired pattern is formed over the substrate 110 after forming the passivation layer 130. Since the polyimide layer 140 has similar chemical properties similar to those a photoresist layer, the desired pattern can be achieved directly through a photolithography step.

Figure 1B:
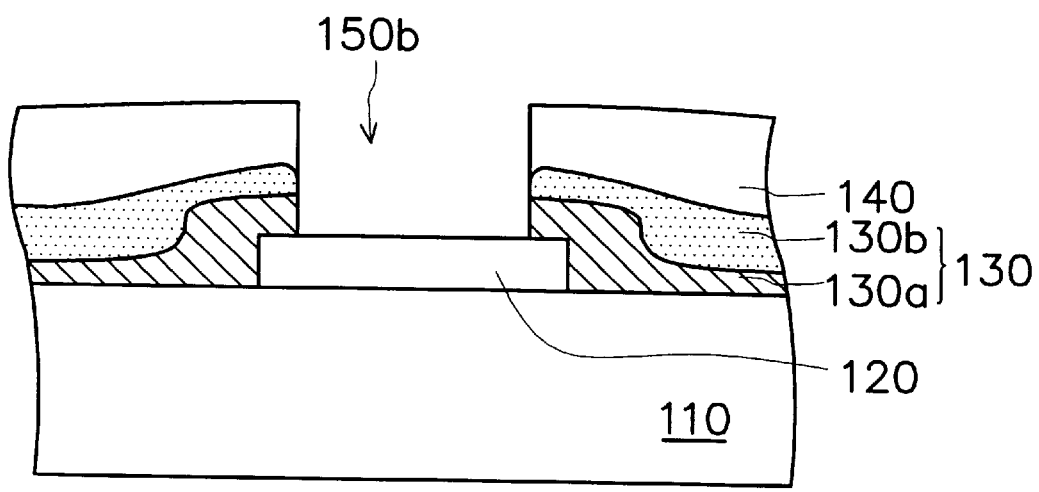

Referring to FIG. 1B, by using the polyimide layer 140 as an etching mask, the passivation layer 130 is etched to form an opening 150b until the bonding pad 120 is exposed. The etching process can be performed by using plasma containing fluorine. The plasma comprises various ions and free radicals. Some species of ions and radicals are active, and therefore react with the bonding pad 120 surface to make corrosion. The corrosion product comprises $F_xAl_y$ and makes it difficult for the bonding pad 120 to properly adhere with metal, therefore causing failure of a subsequently performed metal connection.

In order to overcome the corrosion problem, the bonding pad 120 is rinsed with deionized water comprising carbon dioxide. By way of example, the substrate 110 comprising the bonding pad 120 is submerged in a bath of deionized water injected with a gas such as carbon dioxide.

Before rinsing, the F/Al ratio of the bonding pad 120 surface is about 2.72. The F/Al ratio decreases to about 1.12 if the bonding pad 120 is rinsed with the deionized water for about 10 minutes. It is noted that the F/Al ratio decreases to about 0.662 if the bonding pad 120 is rinsed with the deionized water injected with carbon dioxide for about 2 minutes. The data for the F/Al ratio is obtained by performing Augur spectrum analysis, and the analysis results are given in Table 1.

TABLE 1

| Condition | (F/Al) Ratio | Oxide Thickness (nm) |
| --- | --- | --- |
| Before Rinsing | 2.72 | 41 |
| DI Rinse 10 min | 1.12 | 60.7 |
| DI Rinse 10 min ($CO_2$ Bubbling 2 min) | 0.662 | 56.1 |

DI: deionized water

Figure 2:
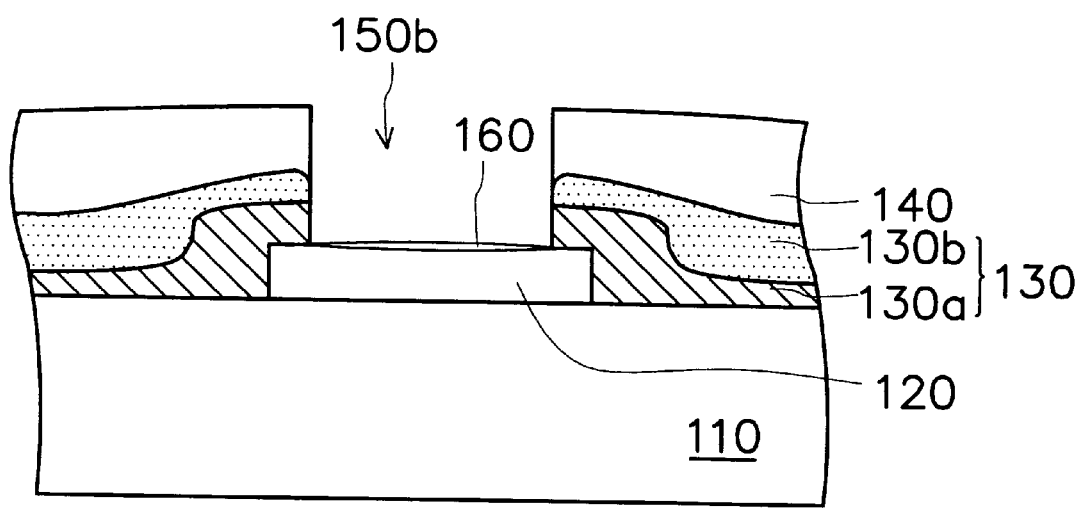
FIG. 2 is a schematic, cross sectional view of a bonding pad in which a native oxide layer is located on it according to the invention.

As shown in FIG. 2, in fact, there is often a native oxide layer 160 exists on the bonding pad 120 surface. The native oxide layer 160 is thicker after the rinsing step. Referring to Table 1, for example, the thickness of the native oxide layer 160 increases from 41 nm to about 56.1 nm if the bonding pad 120 is rinsed with deionized water injected with carbon dioxide for about 2 minutes. It is noted that the thicker oxide layer is helpful in preventing the bonding pad 120 from sustaining further corrosion.

Table 2 shows how the time period of the carbon dioxide injection relates to the F/Al ratio. If the bonding pad 120 is rinsed with deionized water injected with carbon dioxide for about 6 minutes, the F/Al ratio decreases to about 0.538, which is smaller than the result of the 2 minutes injection. The data of the F/Al ratio and the thickness given in Table 2 is obtained by performing Augur spectrum analysis.

TABLE 2

| Condition | (F/Al) Ratio | Oxide Thickness (nm) |
|---|---|---|
| DI Rinse 10 min (CO$_2$ Bubbling 2 min) | 0.66 | 47.4 |
| DI Rinse 10 min (CO$_2$ Bubbling 2 min) | 0.538 | 33.6 |

DI: deionized water

It should be understood that the time periods of the deionized water rinse and the carbon dioxide gas injection are not limited to the values described above. These parameters can be adjusted to optimize each rinsing process.

As the rinse time increases, it is noted that the thickness of the native oxide layer will reach an upper limit. That is to say the native oxide layer does not become thicker too much, and the properties such as conductivity or resistance of the bonding pad are under guarantee.

After rinsing with deionized water comprising carbon dioxide, a metal connection is performed on the bonding pad. The connection is performed by, for example, forming a metal bond on the bonding pad. The details in this connection step are not key points of the present invention, so they are not further described here.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all Such modifications and similar arrangements.

What is claimed is:

1. A method for treating a bonding pad, compromising:
   providing a substrate having the bonding pad formed thereon, the bonding pad comprising aluminum (Al);
   forming a passivation layer on the bonding pad and the substrate;
   using an etchant containing fluorine (F) to etch the passivation layer until a top surface of the bonding pad is exposed, and a product of $F_xAl_y$ is formed on the exposed top surface with a ratio of F to Al; and
   rinsing the bonding pad with a deionized water injected with carbon dioxide gas to decrease the ratio of F to Al on the exposed top surface of the bonding pad.

2. The method of claim 1, wherein the deionized water is injected with the carbon dioxide gas for about 2 minutes.

3. The method of claim 1, wherein the deionized water is injected with the carbon dioxide gas for about 6 minutes.

4. The method of claim 1, wherein the step of rinsing the bonding pad is performed for about 10 minutes.

5. A method of treating a bonding pad on a substrate, comprising:
   forming a passivation layer on the bonding pad and the substrate;
   etching the passivation layer until a top surface of the bonding pad is exposed, while a native oxide is formed on the top surface bonding pad consequently; and
   thickening the native oxide layer to provide a protection effect to the bonding pad by rinsing the bonding pad with deionized water being injected with carbon dioxide gas.

6. The method of claim 5, wherein the deionized water is injected with the carbon dioxide gas for about 6 minutes.

7. The method of claim 5, wherein the deionized water is injected with the carbon dioxide gas for about 2 minutes.

8. The method of claim 5, wherein the native oxide layer is thickened from about 41 nm to about 56.1 nm.

9. The method of claim 5, wherein the deionized water is injected with carbon dioxide gas for about six minutes.

10. The method of claim 5, wherein the step for rinsing the bonding pad is performed for about ten minutes.

11. The method of claim 1, wherein the passivation layer comprises a phosphosilicate layer and a silicon nitride layer, wherein the phosphosilicate layer is formed under the silicon nitride layer.

12. The method of claim 5, wherein the passivation layer comprises a phosphosilicate layer and a silicon nitride layer, wherein the phosphosilicate layer is formed under the silicon nitride layer.

13. The method of claim 11, wherein phosphosilicate glass layer has a thickness of about 2000–7000 angstroms and the silicon nitride layer has a thickness of about 5000–9000 angstroms.

14. A method for treating a bonding pad on a substrate, the method comprising:
   forming a passivation layer to cover the bonding pad and the substrate;
   forming a patterned photoresist layer on the passivation layer, the patterned photoresist layer exposing a part of the passivation layer covering the bonding pad;
   removing the exposed passivation layer until the bonding pad is exposed; and
   rinsing the exposed bonding pad with deionized water being injected with carbon dioxide prior to removing the photoresist layer.

* * * * *